United States Patent
Koizumi

(10) Patent No.: US 11,404,238 B2
(45) Date of Patent: Aug. 2, 2022

(54) CONTROL METHOD FOR ELECTRON MICROSCOPE AND ELECTRON MICROSCOPE

(71) Applicant: JEOL Ltd., Tokyo (JP)

(72) Inventor: Mitsuru Koizumi, Tokyo (JP)

(73) Assignee: JEOL Ltd., Tokyo (JP)

( * ) Notice: Subject to any disclaimer, the term of this patent is extended or adjusted under 35 U.S.C. 154(b) by 210 days.

(21) Appl. No.: 17/015,255

(22) Filed: Sep. 9, 2020

(65) Prior Publication Data
US 2021/0074506 A1  Mar. 11, 2021

(30) Foreign Application Priority Data
Sep. 10, 2019 (JP) .............. JP2019-164661

(51) Int. Cl.
*H01J 37/075*  (2006.01)
*H01J 37/24*  (2006.01)
*H01J 37/26*  (2006.01)
*H01J 37/28*  (2006.01)

(52) U.S. Cl.
CPC .......... *H01J 37/075* (2013.01); *H01J 37/241* (2013.01); *H01J 37/265* (2013.01); *H01J 37/28* (2013.01); *H01J 2237/06308* (2013.01)

(58) Field of Classification Search
CPC ...... H01J 37/075; H01J 37/241; H01J 37/265; H01J 37/28; H01J 2237/06308
See application file for complete search history.

(56) References Cited

U.S. PATENT DOCUMENTS

| | | | | |
|---|---|---|---|---|
| 2,506,660 A | * | 5/1950 | Bruck | H01J 21/08 313/271 |
| 3,435,187 A | * | 3/1969 | Sciaky | B23K 15/02 219/130.33 |
| 2018/0374673 A1 | * | 12/2018 | Yabu | H01J 37/1471 |
| 2020/0161086 A1 | * | 5/2020 | Chun | H01J 37/065 |

FOREIGN PATENT DOCUMENTS

| | | | |
|---|---|---|---|
| JP | H5182620 A | 7/1993 | |
| JP | 2018106899 A | 7/2018 | |
| WO | WO-2011064960 A1 * | 6/2011 | ............ H01J 37/22 |

OTHER PUBLICATIONS

Office Action issued in JP2019-164661 dated Jun. 15, 2021.

* cited by examiner

*Primary Examiner* — Sean M Luck
(74) *Attorney, Agent, or Firm* — The Webb Law Firm

(57) ABSTRACT

There is provided a control method for an electron microscope including a thermionic-emission gun of self-bias type using a fixed bias resistor, an accelerating voltage power supply supplying an accelerating voltage to the thermionic-emission gun, and an optical system for irradiating a specimen with an electron beam. The control method includes: obtaining a value of a load current which is a current passing through an accelerating voltage power supply; determining a filament height of the thermionic-emission gun based on the value of the load current; and setting a condition of the optical system based on the filament height.

5 Claims, 6 Drawing Sheets

| | 0.4mm | 0.5mm | 0.6mm | 0.7mm | 0.8mm |
|---|---|---|---|---|---|
| Biggest | a1[A] | a2[A] | a3[A] | a4[A] | a5[A] |
| Large | b1[A] | b2[A] | b3[A] | b4[A] | b5[A] |
| Middle | c1[A] | c2[A] | c3[A] | c4[A] | c5[A] |
| Standard | d1[A] | d2[A] | d3[A] | d4[A] | d5[A] |
| Small | e1[A] | e2[A] | e3[A] | e4[A] | e5[A] |

CONTROL METHOD FOR ELECTRON MICROSCOPE AND ELECTRON MICROSCOPE

CROSS-REFERENCE TO RELATED APPLICATION

This application claims priority to Japanese Patent Application No. 2019-164661 filed Sep. 10, 2019, the disclosure of which is hereby incorporated by reference in its entirety.

BACKGROUND OF THE INVENTION

Field of the Invention

The present invention relates to a control method for an electron microscope and an electron microscope.

Description of Related Art

As an electron gun used in an electron microscope, a thermionic-emission gun is known. As the thermionic-emission gun, there is used a thermionic-emission gun that uses a filament made of tungsten or a thermionic-emission gun that uses a filament made of a single crystal of lanthanum boride ($LaB_6$).

In such a thermionic-emission gun, in a case where the filament is degraded, replacement of the filament is required (see, e.g., JP-A-2018-106899).

However, when the filament is replaced, there may be a case where the brightness of the electron gun changes due to misalignment in a step of manufacturing the filament or an installation error of the filament. When the brightness of the electron gun changes, there may be a case where an amount of an illumination current, i.e., a probe current, significantly changes. Thus, when the probe current significantly changes, an observation result or an analysis result is influenced, and hence continuous observation or analysis is hindered. For example, in EDS analysis, when the probe current changes due to replacement of the filament, it is not possible to simply compare an EDS spectrum obtained before the replacement of the filament with an EDS spectrum obtained after the replacement of the filament.

SUMMARY OF THE INVENTION

According to a first aspect of the invention, there is provided a control method for an electron microscope including a thermionic-emission gun of self-bias type using a fixed bias resistor, an accelerating voltage power supply supplying an accelerating voltage to the thermionic-emission gun, and an optical system for irradiating a specimen with an electron beam, the control method including:

obtaining a value of a load current which is a current passing through the accelerating voltage power supply;

determining a filament height of the thermionic-emission gun based on the value of the load current; and setting a condition of the optical system based on the filament height.

According to a second aspect of the invention, there is provided an electron microscope including:

a thermionic-emission gun of self-bias type using a fixed bias resistor;

an accelerating voltage power supply supplying an accelerating voltage to the thermionic-emission gun;

an ammeter measuring a value of a load current which is a current passing through the accelerating voltage power supply;

an optical system for irradiating a specimen with an electron beam; and a control section controlling the thermionic-emission gun and the optical system, the control section performing:

processing of obtaining the value of the load current;

processing of determining a filament height of the thermionic-emission gun based on the value of the load current; and processing of setting a condition of the optical system based on the filament height.

DESCRIPTION OF THE INVENTION (1) According to an embodiment of the invention, there is provided a control method for an electron microscope including a thermionic-emission gun of self-bias type using a fixed bias resistor, an accelerating voltage power supply supplying an accelerating voltage to the thermionic-emission gun, and an optical system for irradiating a specimen with an electron beam, the control method including:

obtaining a value of a load current which is a current passing through the accelerating voltage power supply;

determining a filament height of the thermionic-emission gun based on the value of the load current; and setting a condition of the optical system based on the filament height.

In the control method for an electron microscope described above, the condition of the optical system is set based on the filament height, and hence it is possible to reduce change of a probe current caused by replacement of the filament.

(2) According to the embodiment of the invention, there is provided an electron microscope including:

a thermionic-emission gun of self-bias type using a fixed bias resistor;

an accelerating voltage power supply supplying an accelerating voltage to the thermionic-emission gun;

an ammeter measuring a value of a load current which is a current passing through the accelerating voltage power supply;

an optical system for irradiating a specimen with an electron beam; and a control section controlling the thermionic-emission gun and the optical system, the control section performing:

processing of obtaining the value of the load current;

processing of determining a filament height of the thermionic-emission gun based on the value of the load current; and processing of setting a condition of the optical system based on the filament height.

In the electron microscope described above, the control section sets the condition of the optical system based on the filament height, and hence it is possible to reduce the change of the probe current caused by the replacement of the filament.

Preferred embodiments of the invention are described in detail below with reference to the drawings. It is noted that the following embodiments do not unduly limit the scope of the invention as stated in the claims. In addition, all of the elements described below are not necessarily essential requirements of the invention.

1. Electron Microscope

Figure 1:
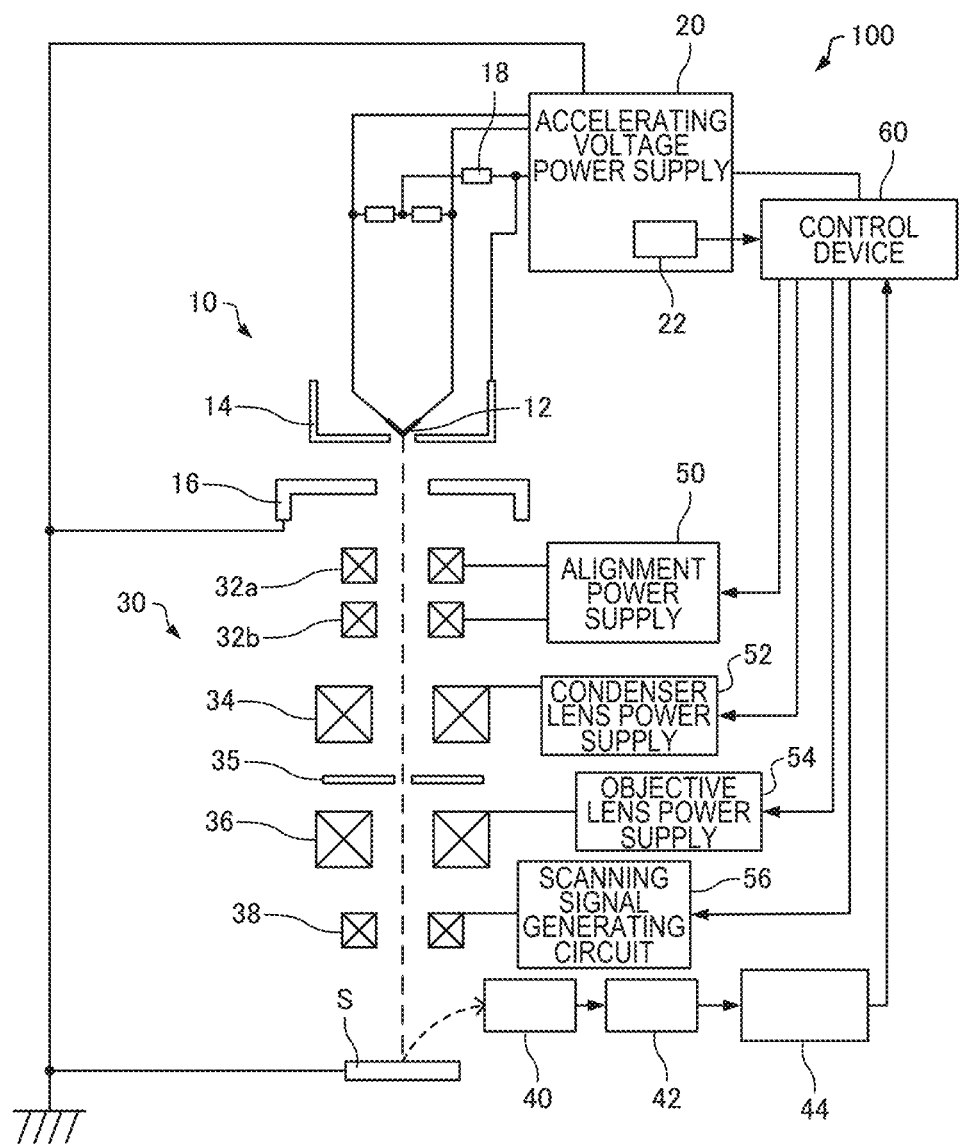
FIG. 1 is a diagram illustrating a configuration of an electron microscope according to an embodiment of the invention.

First, an electron microscope according to an embodiment of the invention will be described with reference to the drawings. FIG. 1 is a diagram illustrating a configuration of an electron microscope 100 according to an embodiment of the invention.

The electron microscope 100 includes an electron gun 10, an accelerating voltage power supply 20, an optical system 30, a detector 40, an amplifier 42, an AD converter 44, an alignment power supply 50, a condenser lens power supply 52, an objective lens power supply 54, a scanning signal generating circuit 56, and a control device 60 (an example of a control section).

The electron gun 10 emits an electron beam. The electron gun 10 is a thermionic-emission gun. The thermionic-emission gun is an electron gun which uses thermionic emission. The electron gun 10 includes a cathode 12, a Wehnelt electrode 14, an anode 16, and a bias resistor 18.

The cathode 12 is, e.g., a filament made of tungsten. Note that the cathode 12 may also be a filament made of a single crystal of lanthanum boride ($LaB_6$). The Wehnelt electrode 14 is disposed between the cathode 12 and the anode 16. A minus bias voltage is applied to the cathode 12, and the Wehnelt electrode 14 is used to control the amount of emitted electrons. The anode 16 is, e.g., a ground potential, and acceleration energy of the electron beam to a specimen S is determined by a potential difference between the cathode 12 and the anode 16. A crossover is formed by lens action of the cathode 12, the Wehnelt electrode 14, and the anode 16.

The bias resistor 18 is a resistor for generating a self-bias voltage. The bias resistor 18 is disposed between the cathode 12 and the Wehnelt electrode 14. The resistance value of the bias resistor 18 is fixed. The electron gun 10 is a thermionic-emission gun of self-bias type using the fixed bias resistor 18.

In the electron gun 10, a thermoelectron is emitted by heating the cathode 12. The emitted electron is accelerated by the accelerating voltage applied between the cathode 12 and the anode 16. An emission current is controlled by a bias voltage applied to the Wehnelt electrode 14. The emission current is an electron current emitted from the electron gun 10. The crossover is formed by the lens action of the cathode 12, the Wehnelt electrode 14, and the anode 16.

Herein, in the electron gun 10, a voltage generated in the bias resistor 18 by the passage of the emission current through the bias resistor 18 is used as the bias voltage. With this, the emission current is limited. The bias voltage is proportional to the emission current. Thus, the electron gun 10 is the thermionic-emission gun of self-bias type in which the bias voltage is dependent on the emission current.

With regard to the bias voltage, i.e., the self-bias voltage, a voltage corresponding to a voltage drop caused when the whole emission current passes through the bias resistor 18 is applied between the cathode 12 and the Wehnelt electrode 14, and a type of feedback action is generated. Accordingly, even when a factor which fluctuates the emission current occurs, the fluctuation of the emission current is reduced by the action of the self-bias voltage. Consequently, in the electron gun 10, it is possible to stabilize the emission current.

The accelerating voltage power supply 20 supplies an accelerating voltage for accelerating electrons. The accelerating voltage is a voltage applied between the cathode 12 and the anode 16. The accelerating voltage power supply 20 has an ammeter 22 for measuring the value of a load current. The load current is a current passing through the accelerating voltage power supply 20, and is obtained by adding the emission current to a current passing through the accelerating voltage power supply 20 for generating the accelerating voltage.

The optical system 30 includes a first alignment coil 32a, a second alignment coil 32b, a condenser lens 34, an objective aperture 35, an objective lens 36, and a deflection coil 38.

Each of the first alignment coil 32a and the second alignment coil 32b deflects an electron beam emitted from the electron gun 10. The first alignment coil 32a and the second alignment coil 32b are used in, e.g., GUN alignment. The GUN alignment denotes axis alignment in which the electron beam emitted from the electron gun 10 is deflected so as to coincide with the optical axis of the condenser lens 34.

The condenser lens 34 condenses the electron beam. The condenser lens 34 is used to control the probe current and a probe diameter. For example, when excitation of the condenser lens 34 is strengthened, the amount of electrons passing through the objective aperture 35 is reduced and, when the excitation of the condenser lens 34 is weakened, the amount of electrons passing through the objective aperture 35 is increased. In addition, when the excitation of the condenser lens 34 is strengthened, a focal length is reduced, and the reduction ratio of an electron probe is increased. By using these functions, it is possible to control the probe current and the probe diameter. The probe current is a current passing through the electron probe applied to a specimen.

The objective lens 36 is a lens for focusing the electron probe onto a specimen surface. The electron beam is condensed and focused and the electron probe is formed by the condenser lens 34 and the objective lens 36.

The deflection coil 38 is a coil for performing scanning of the electron probe. The scanning of the electron probe is performed by supplying a scanning signal to the deflection coil 38.

The detector 40 detects electrons generated by irradiating the specimen S with the electron beam. A signal detected by the detector 40 is amplified in the amplifier 42 and is then converted to a digital signal by the AD converter 44, and the digital signal is sent to the control device 60.

The alignment power supply 50 supplies an alignment current to the first alignment coil 32a and the second alignment coil 32b. The condenser lens power supply 52 supplies an excitation current to the condenser lens 34. The objective lens power supply 54 supplies the excitation current to the objective lens 36. The scanning signal generating circuit 56 generates a scanning signal, and supplies the scanning signal to the deflection coil 38.

The control device 60 controls individual sections constituting the electron microscope 100. The control device 60 includes, e.g., a central processing unit (CPU), a storage device (random access memory (RAM)), and a read only memory (ROM). In the control device 60, the CPU executes programs stored in the storage device to thereby perform various calculation processing and various control processing.

2. Operation of Electron Microscope 2.1. Processing of Control Device

Next, the operation of the electron microscope 100 will be described. First, a description will be given of the case where a scanning electron microscope image (SEM image) is obtained in the electron microscope 100.

In the case where the SEM image is obtained in the electron microscope 100, the control device 60 controls the scanning signal generating circuit 56 such that a desired area of the specimen S is scanned by the electron probe. With this, the scanning signal is supplied to the deflection coil 38 from the scanning signal generating circuit 56, and the desired area of the specimen S is scanned by the electron probe. Electrons generated by irradiating the specimen S with the electron beam are detected by the detector 40, and a detection signal is amplified by the amplifier 42 and is then sent to the control device 60. The control device 60 generates the SEM image based on the detection signal.

Next, a description will be given of an operation when the electron microscope 100 is activated after the replacement of the filament of the electron gun 10. In the electron microscope 100, the control device 60 controls the condenser lens power supply 52 such that the change of the probe current caused by the replacement of the filament of the electron gun 10 is reduced.

Figure 2:
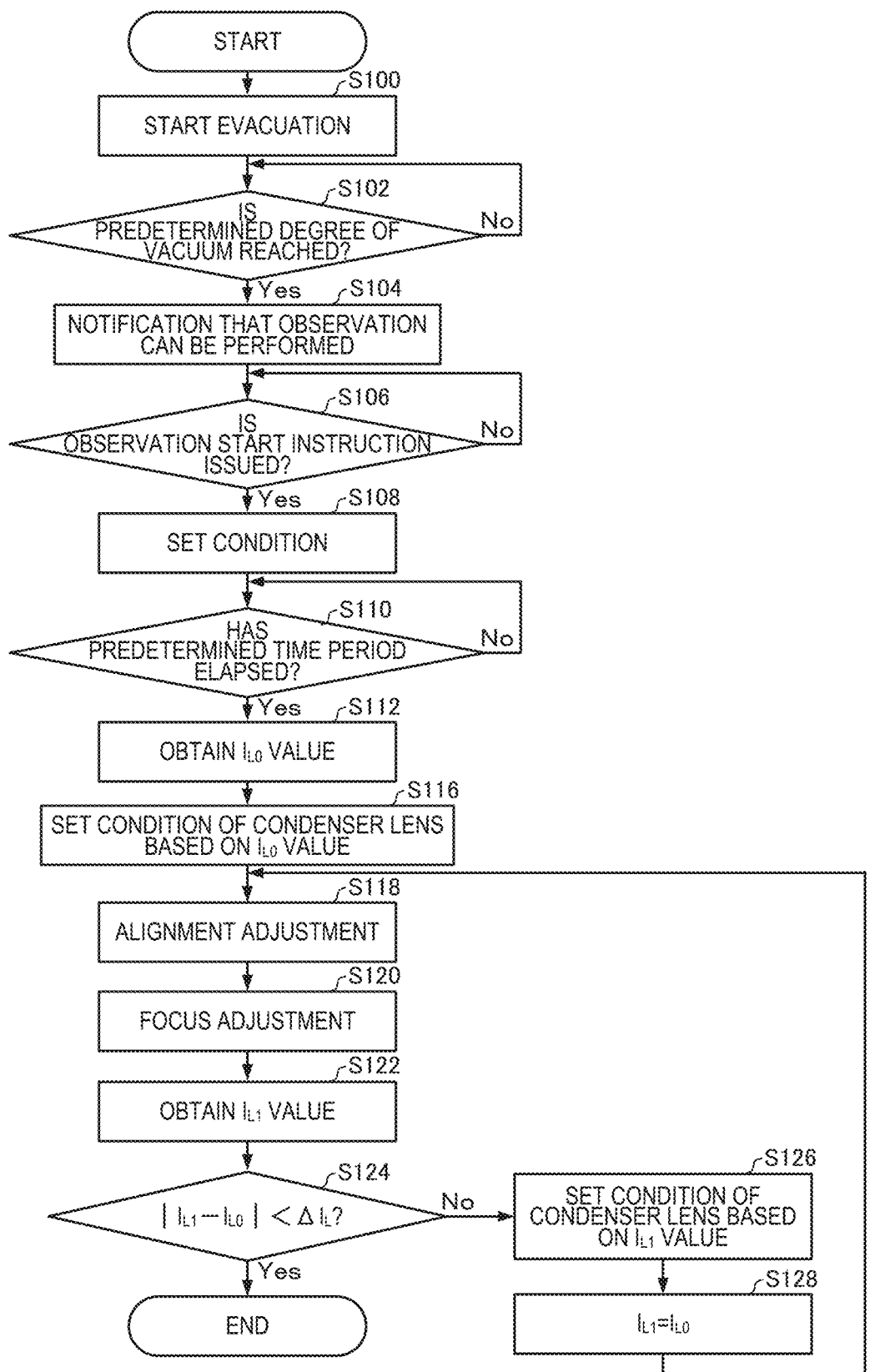
FIG. 2 is a flowchart illustrating an example of processing of a control device.

FIG. 2 is a flowchart illustrating an example of processing of the control device 60 after the filament of the electron gun 10 is replaced.

After the replacement of the filament, each of an optical column and a specimen chamber of the electron microscope 100 has atmospheric pressure. Accordingly, a vacuum pump is operated and the evacuation of the optical column and the specimen chamber is started (S100). The control device 60 monitors the degree of vacuum measured by a vacuum gauge disposed in each of the optical column and the specimen chamber and, in the case where a predetermined degree of vacuum is reached (Yes in S102), the control device 60 notifies a user that observation can be performed (S104). The notification to the user is performed by, e.g., displaying an image notifying the user that that observation can be performed in a display section such as, e.g., a liquid crystal display.

When the control device 60 receives input of an observation start instruction from the user (Yes in S106), the control device 60 sets observation conditions of the SEM image in the accelerating voltage power supply 20, the alignment power supply 50, the condenser lens power supply 52, the objective lens power supply 54, and the scanning signal generating circuit 56 (S108). The observation conditions of the SEM image may be preset initial conditions of SEM image observation, or may also be observation conditions of the SEM image input by the user.

The control device 60 waits for a preset predetermined time period (S110). With this, it is possible to stabilize the individual sections constituting the electron microscope 100. The predetermined time period is, e.g., from 10 seconds to 60 seconds.

After a lapse of the predetermined time period (Yes in S110), the control device 60 obtains the value of a load current $I_{L0}$ from the ammeter 22 of the accelerating voltage power supply 20 (S112).

The control device 60 sets the condition of the condenser lens 34 based on the obtained value of the load current $I_{L0}$ (S114). Specifically, the control device 60 determines a filament height based on the obtained value of the load current $I_{L0}$, and determines the condition of the condenser lens 34 based on the determined filament height. The control device 60 controls the condenser lens power supply 52 such that the determined condition of the condenser lens 34 is achieved. With this, the condenser lens 34 has the determined condition. The detail of a setting method of the condition of the condenser lens 34 will be described later.

Next, the control device 60 performs adjustment of the GUN alignment (S118). For example, the control device 60 operates the first alignment coil 32a and the second alignment coil 32b such that the electron beam emitted from the electron gun 10 coincides with the optical axis of the condenser lens 34. The operation of each of the first alignment coil 32a and the second alignment coil 32b can be controlled by controlling the alignment power supply 50. For example, the control device 60 executes known automatic GUN alignment to thereby perform the alignment adjustment.

Herein, the adjustment of the GUN alignment is performed by moving the electron beam in two directions in a plane to search for optimum conditions by controlling the excitation current supplied to two alignment coils (the first alignment coil 32a and the second alignment coil 32b). In order to perform the adjustment of the GUN alignment, it is necessary to optimize a signal amount detected by the detector 40. It is possible to optimize the signal amount by using, e.g., gain adjustment by known automatic contrast-brightness adjustment. Thus, although it takes time to perform the adjustment of the GUN alignment, the adjustment of the GUN alignment is performed during the time period for stabilizing the condenser lens 34 in the present processing, and hence the adjustment of the GUN alignment is performed efficiently, and it is possible to reduce a time period required before the observation can be started after the filament replacement.

Next, the control device 60 performs adjustment of focus (S120). The control device 60 operates the objective lens 36 such that the optimum focus is obtained. The operation of the objective lens 36 can be controlled by controlling the objective lens power supply 54. For example, the control device 60 executes known autofocus to thereby perform the adjustment of the focus. Note that the above-described gain adjustment may be performed also when the adjustment of the focus is performed.

Next, the control device 60 obtains the value of a load current $I_{L1}$ from the ammeter 22 of the accelerating voltage power supply 20 (S122).

The control device 60 determines a difference between the value of the load current $I_{L1}$ and the value of the load current $I_{L0}$, and determines whether or not the difference is less than a preset reference value $\Delta I_L$ (S124). That is, it is determined whether or not $|I_{L1}-I_{L0}|<\Delta I_L$ is satisfied. With this, it is possible to determine whether or not the value of the load current is stabilized.

In the case where it is determined that $|I_{L1}-I_{L0}|<\Delta I_L$ is not satisfied (No in S124), the control device 60 sets the condition of the condenser lens 34 based on the obtained value of the load current $I_{L1}$ (S126). Specifically, the control device 60 determines the filament height based on the obtained value of the load current $I_{L1}$, and determines the condition of the condenser lens 34 based on the determined filament height. The control device 60 controls the condenser lens power supply 52 such that the determined condition of the condenser lens 34 is achieved. With this, the condenser lens 34 has the determined condition. The detail of a setting method of the condition of the condenser lens 34 will be described later.

After the control device 60 sets the condition of the condenser lens 34 based on the obtained value of the load current $I_{L1}$, the control device 60 sets the value of the load current $I_{L1}$ as the value of the load current $I_{L0}$ (S128), and returns to Step S118. Subsequently, the control device 60 repeats the steps of the processing Step S118, Step S120, Step S122, Step S124, Step S126, and Step S128 until $|I_{L1}-I_{L0}|<\Delta I_L$ is satisfied.

In the case where it is determined that $|I_{L1}-I_{L0}|<\Delta I_L$ is satisfied (Yes in S124), the control device 60 ends the processing.

2.2. Condition Setting

Next, a description will be given of processing of setting the condition of the condenser lens 34. Processing operations of setting the condition of the condenser lens 34 S116 and S126 include processing of determining the filament height based on the obtained value of the load current $I_{L0}$, and processing of setting the condition of the condenser lens 34 based on the determined filament height. The filament height is a distance between the tip of the filament and the tip of the Wehnelt electrode 14 (see a filament height H in FIG. 5).

Figures 3, 4:
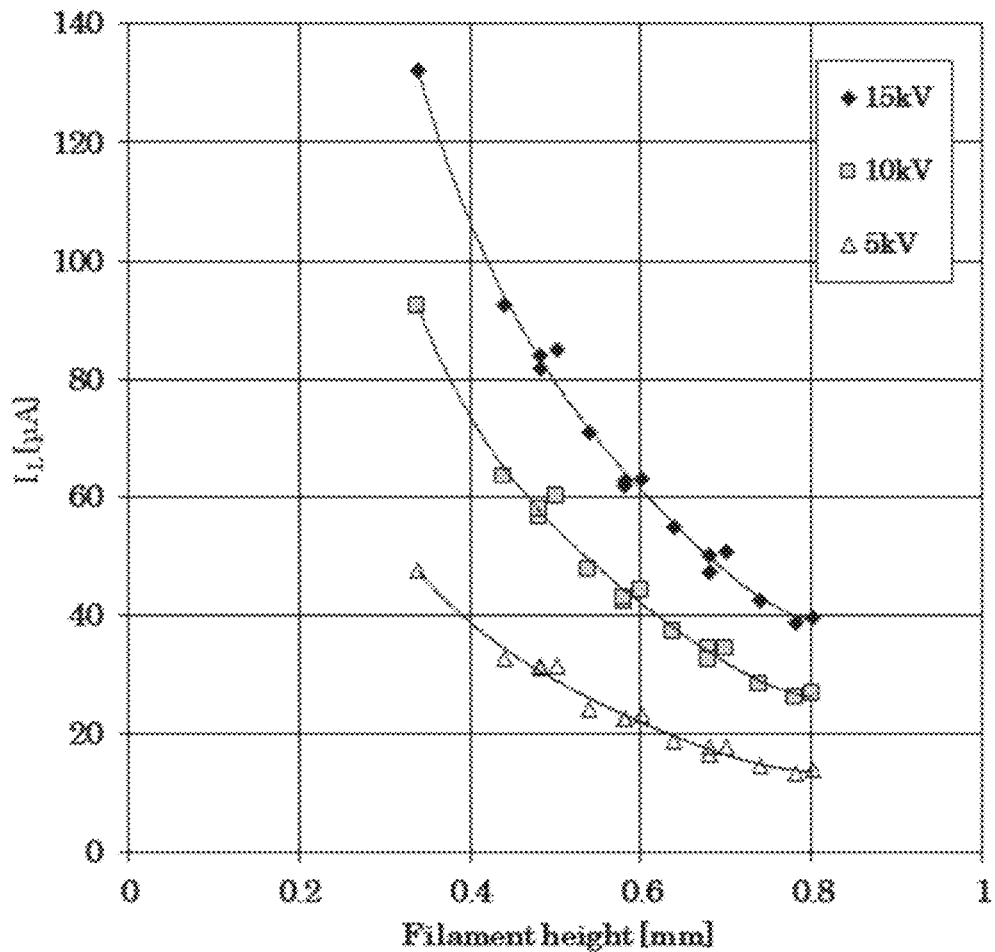
FIG. 3 is a graph illustrating a relationship between a value of a load current and a filament height.
FIG. 4 is a table illustrating a relationship between a filament height and a condition of a condenser lens.

FIG. 3 is a graph illustrating a relationship between the value of the load current $I_L$ and the filament height H. FIG. 3 illustrates the relationship between the value of the load current $I_L$ and the filament height H for each accelerating voltage. Specifically, FIG. 3 illustrates the relationship between the value of the load current $I_L$ and the filament height H in the case where the accelerating voltage is 5 kV, the relationship between the value of the load current $I_L$ and the filament height H in the case where the accelerating voltage is 10 kV, and the relationship between the value of the load current $I_L$ and the filament height H in the case where the accelerating voltage is 15 kV.

It is possible to determine the filament height H from the accelerating voltage and the value of the load current $I_L$ by using the graph illustrated in FIG. 3.

FIG. 4 is a table 2 illustrating a relationship between the filament height H and the condition of the condenser lens 34. In the table 2 in FIG. 4, the condition (excitation current) of the condenser lens 34 is determined by the filament height H and the desired probe current. In an example in FIG. 4, the probe current can be set to five levels consisting of Biggest, Large, Middle, Standard, and Small. For example, the probe current is about 10 nA in the case of Biggest, the probe current is about 2 nA in the case of Large, the probe current is about 400 pA in the case of Middle, the probe current is about 80 pA in the case of Standard, and the probe current is about 16 pA in the case of Small.

The probe current can be optionally selected by the user. For example, in the case where a large probe current is required as in the case of EDS analysis, Biggest or Large is selected and, in the case of normal SEM observation, Middle or Standard is selected. In addition, in the case where a specimen vulnerable to the electron beam is observed, Small is selected. With regard to the selection of the probe current, for example, the user may input the desired probe current together with an instruction to start the observation. Note that the probe current may also be set in advance.

In the table 2 illustrated in FIG. 4, in the case where the filament height is 0.4 mm and the desired probe current is Biggest, the excitation current of the condenser lens 34 is a1 [A]. In addition, for example, in the case where the filament height is 0.6 mm and the desired probe current is Large, the excitation current of the condenser lens 34 is b3 [A].

Thus, by using the table 2, it is possible to set the condition of the condenser lens 34 for obtaining the desired probe current from the filament height H. Note that, herein, the excitation current is selected as the condition of the condenser lens 34, but the condition of the condenser lens 34 is not limited thereto, and the condition of the condenser lens 34 may be any condition as long as the condition is a control value for controlling the condenser lens 34. An example of such a control value includes a DAC value.

For example, when the filament is replaced, even in the case where the brightness of the electron gun 10 changes due to misalignment in the step of manufacturing the filament or an installation error of the filament, it is possible to reduce the change of the probe current applied to the specimen by setting the condition of the condenser lens 34 by using the table 2.

2.3. Relationship Between Filament Height and Brightness of Electron Gun

Figure 5:
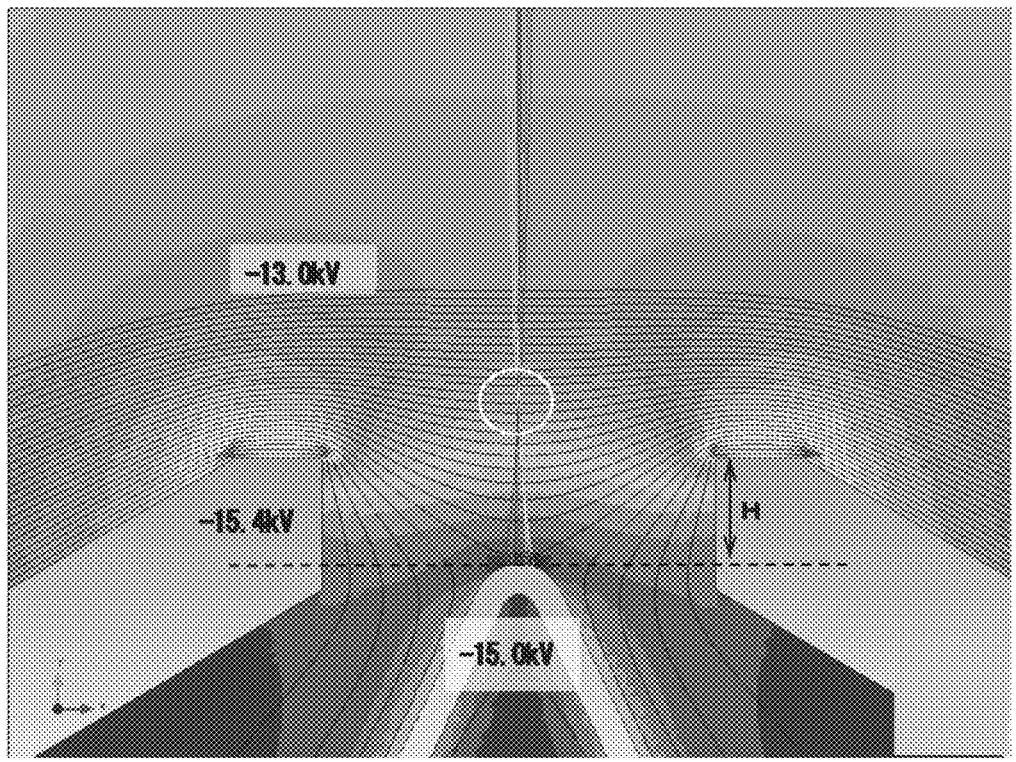
FIG. 5 illustrates an evaluation result of a crossover by electric field simulation.
Figure 6:
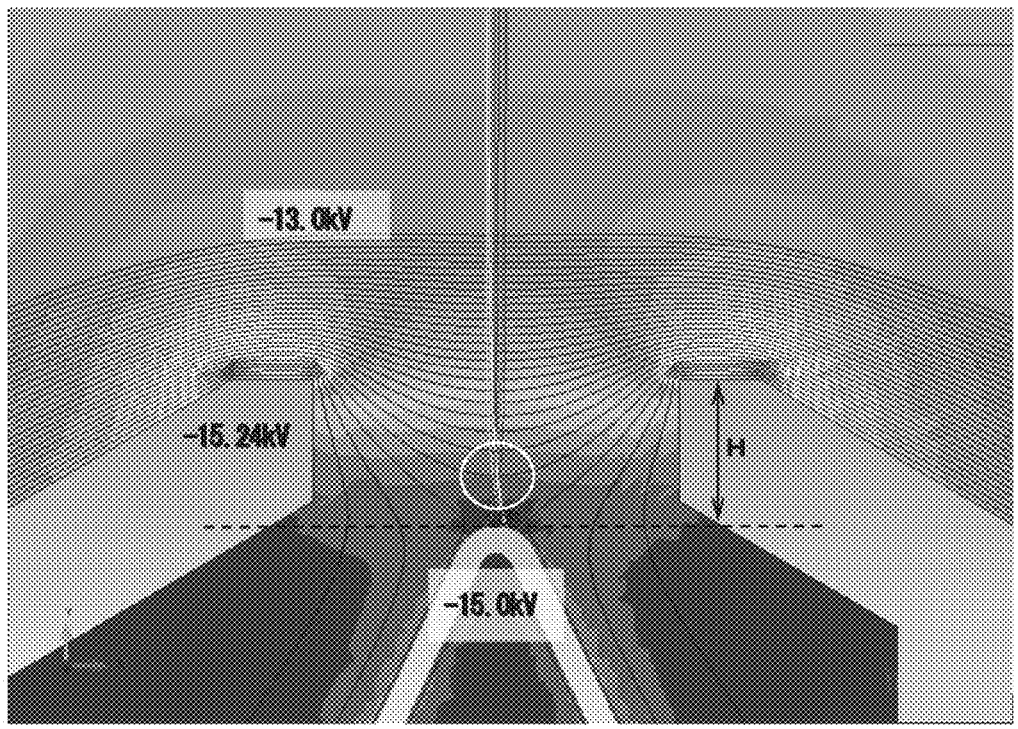
FIG. 6 illustrates an evaluation result of a crossover by electric field simulation.

Each of FIGS. 5 and 6 illustrate an evaluation result of the crossover by electric field simulation. In each of FIGS. 5 and 6, measurement is performed at an accelerating voltage of 15 kV while the filament height H is changed. Note that a bias electric field is corrected based on the result of the value of the load current $I_L$ illustrated in FIG. 3.

FIG. 5 illustrates the case where the filament height H is in the vicinity of 0.4 mm, and the value of the load current is about 100 μA. FIG. 6 illustrates the case where the filament height H is in the vicinity of 0.6 mm, and the value of the load current is about 60 μA. In the case where the bias resistor is set to 4 MΩ, the bias voltage is 4 M[Ω]×100μ[A]=400 [V] in the case of FIG. 5, and the bias voltage is 4 M[Ω]×60μ[A]=240 [V] in the case of FIG. 6. With these conditions, when electrons are emitted from the vicinity of the filament with an initial energy of about 0.1 eV, the electrons have different trajectories due to potential gradient. Specifically, a crossover converges outside the Wehnelt electrode in FIG. 5, and the crossover converges inside the Wehnelt electrode in FIG. 6. Note that, in each of FIGS. 5 and 6, the position of the crossover is circled. This indicates that the change of the filament height H changes the position of the crossover in cooperation with the change of the emission current and the bias voltage, and it can be seen that the change of the filament height H also changes the brightness of the electron gun.

Note that the electron emitted from the filament is a thermoelectron, and hence, in reality, the initial energy has an energy distribution wider than 0.1 eV. Consequently, the actual operation of the electron gun does not completely coincide with examples in FIGS. 5 and 6. However, a little increase or decrease in initial energy does not significantly change the position of the crossover, and the change of the filament height H changes the position of the crossover more significantly than the increase or decrease in initially energy. The change of the brightness of the electron gun has been studied with the same filament used and the filament height changed.

Figure 7:
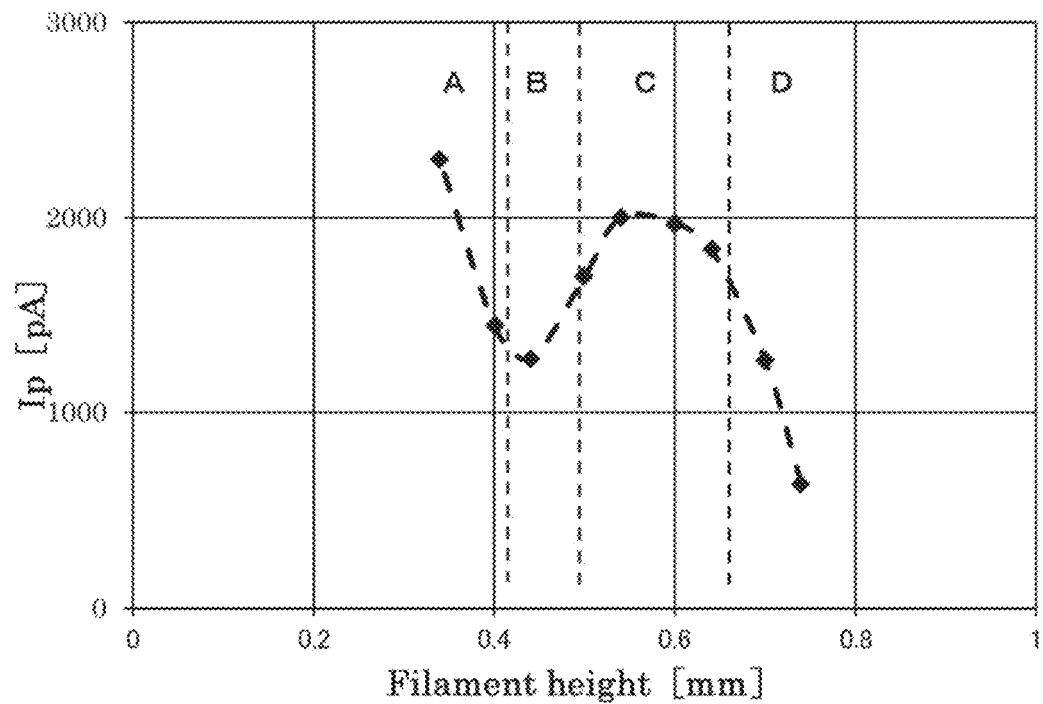
FIG. 7 is a graph illustrating a relationship between a filament height and a probe current.

FIG. 7 is a graph illustrating a relationship between the filament height H and the probe current Ip. The graph in FIG. 7 is a result obtained by measuring the change of the probe current Ip in the case where the condition of the condenser lens is constant and the condition of the GUN alignment is optimized when the same combination of the filament and the Wehnelt electrode is used and the filament height H is changed.

The change of the probe current Ip in FIG. 7 is obtained when the condition of the condenser lens is constant. Consequently, the change of the probe current Ip corresponds to the change of the brightness of the electron gun. The brightness denotes a quantity indicative of the intensity of the electron gun, and is expressed in terms of a current density per unit solid angle.

Note that the change of the probe current Ip includes the change of the position of the crossover described above, and the change of the position of the crossover is small relative to a distance from the position of the crossover to the condenser lens. For example, while the distance from the position of the crossover to the condenser lens is several centimeters, the change of the position of the crossover is several millimeters or less. Accordingly, the change of the probe current Ip (i.e., the change of the brightness) caused by the change of the position of the cross over is considered to be extremely small (e.g., 10% or less).

Consequently, in the graph illustrated in FIG. 7, it can be said that the change of the probe current Ip corresponds to the change of the brightness of the electron gun.

In FIG. 7, the graph is divided into an area A close to the Wehnelt electrode, an area B in which brightness is reduced, an area C in which optimum brightness is obtained, and an area D in which brightness is reduced. Each of the area A and the area B has a condition which has a weak bias effect, and the area D has an extremely strong bias effect, and hence the brightness is reduced. The bias effect denotes a degree of limitation of the emission current by the bias voltage and, as the bias effect becomes stronger, the emission current is limited more significantly. In the self-bias type electron gun, the bias voltage is determined by the value of the load current including dark current, and the bias effect is changed by the filament height H.

Herein, in the electron gun, in general, a maximum brightness condition is present before a cut-off voltage, and the brightness is reduced under a condition which weakens the bias effect before the maximum brightness condition. The area B, the area C, and the area D satisfy the above relationship. In addition, it seems that the bias effect is weak in the area A, and hence the probe current is increased and the apparent brightness is increased, but the area A has a problem in which the crossover is split into a plurality of bright spots, and hence this condition is not the optimum bias condition. From this, when the filament height H is in the area C, the bias effect is optimized and high brightness is obtained.

The graph in FIG. 7 illustrates the change of the probe current when the condition of the condenser lens is fixed and the filament height H is changed, and the condition of the condenser lens which makes the probe current constant is used for setting the condition of the condenser lens. This condition has a curve similar to that in the graph in FIG. 7 and the curve can be approximately formed by using three or more curves. The table 2 in FIG. 4 collectively illustrates the conditions of the condenser lens which make the probe current constant when the filament height is changed. For example, the probe current Ip is represented by the following relational expression:

$$Ip(AccV,C1,H) \approx -A(AccV,C1) \cdot H^3 + B(AccV,C1) \cdot H^2 - C(AccV,C1) \cdot H + D(AccV,C1)$$

wherein Ip is the probe current, AccV is the accelerating voltage, and C1 is the condition of the condenser lens. In addition, A, B, C, and D are coefficients which change individually according to the filament height H.

The above table 2 can be created from the above expression.

3. Effect

According to an embodiment of the invention, there is provided a control method for an electron microscope including the thermionic-emission gun 10 of self-bias type using the fixed bias resistor 18, the accelerating voltage power supply 20 supplying the accelerating voltage to the thermionic-emission gun 10, and the condenser lens 34 for irradiating the specimen with the electron beam, the control method including: obtaining the value of the load current which is the current passing through the accelerating voltage power supply 20; determining the filament height H of the thermionic-emission gun 10 based on the value of the load current; and setting the condition of the condenser lens 34 based on the filament height H. Consequently, it is possible to reduce the change of the probe current caused by the replacement of the filament.

For example, conventionally, in the case where the brightness of the electron gun is low and the desired probe current is not obtained after the replacement of the filament, the filament has been abandoned as a defective filament. In contrast to this, in the present embodiment, even when the brightness of the thermionic-emission gun 10 is low, the desired probe current is obtained by the action of the condenser lens 34, and hence the filament can be used.

For example, in the example illustrated in FIG. 7, the filament having a filament height of about 0.45 mm which is positioned in the area B has been abandoned because the sufficient probe current is not obtained. In contrast to this, in the present embodiment, even when the filament positioned in the area B is used, it is possible to obtain the same probe current as that of the area C by the action of the condenser lens 34, and hence the filament can be used.

In addition, in the present embodiment, the filament height H is determined based on the value of the load current and the condition of the condenser lens 34 is set based on the filament height H, and hence it is possible to easily set the condition of the condenser lens 34. For example, in the case where the condition of the condenser lens 34 is set based on the probe current, the probe current needs to be measured by using a Faraday cup or the like. In the present embodiment, it is only necessary to obtain the value of the load current which can be easily obtained, and hence it is possible to easily set the condition of the condenser lens 34.

Further, in the present embodiment, the thermionic-emission gun of self-bias type 10 using the fixed bias resistor 18 is used, and hence it is possible to adopt the configuration which is smaller and simpler than that of a thermionic-emission gun in which the bias resistor can be varied.

4. Modification

Note that the invention is not limited to the embodiments described above, and can be variously modified and implemented within the scope of the invention.

4.1. First Modification

For example, in the embodiments described above, while each of the filament made of tungsten and the filament made of the single crystal of lanthanum boride ($LaB_6$) is described as the filament used as the cathode 12 of the electron gun 10, the material of the filament is not limited thereto. Examples of the material of the filament used as the cathode 12 include Ta, Nb, Mo, Ru, Rh, V, Ti, and Ni. In addition, as the cathode 12, a metal wire to which Th, $Y_2O_3$, $ThO_2$, Ba, $CeO_2$, Os, or Ir is applied or a metal wire filament containing one of these metals may be used. With this, it is possible to reduce a work function on a metal surface, and hence it is possible to lower heating temperature and implement a long-life electron source.

Further, as the cathode 12, in addition to the filament made of the single crystal of $LaB_6$, a filament made of a single crystal of $CeB_6$, $CaB_6$, $BaB_6$, ZrC, SiC, TaC, TiC, or NbC may also be used. In addition, an impregnated cathode including an emissive material made of BaO, CaO, or $Al_2O_3$ in sintered porous tungsten is formed into a chip of which an emissive surface at a tip is rounded and the chip is mounted to a tip of a metal wire, and the metal wire having the impregnated cathode may also be used as the cathode 12 of the electron gun 10.

4.2. Second Modification

Figure 8:
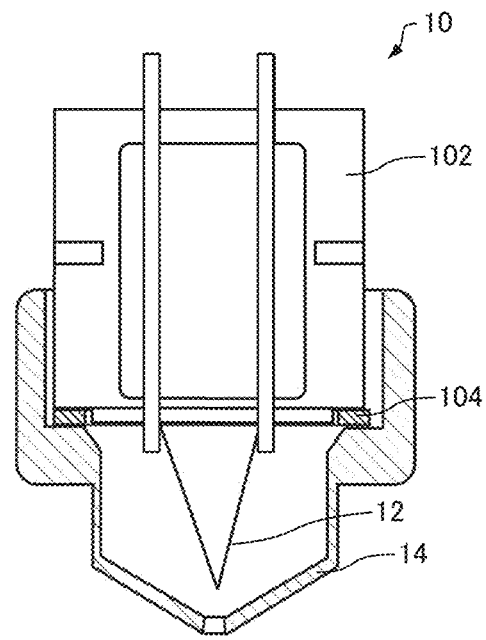
FIG. 8 schematically illustrates part of an electron gun.
Figure 9:
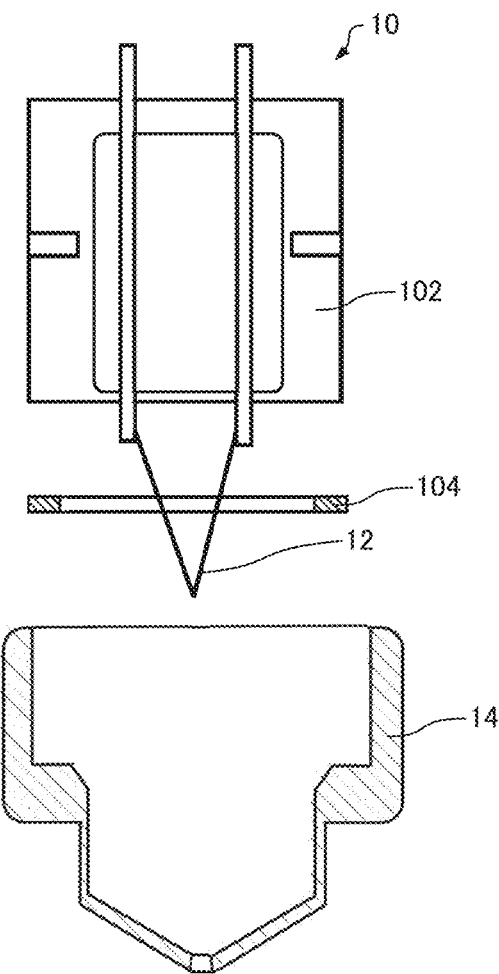
FIG. 9 schematically illustrates part of an electron gun.

Each of FIGS. 8 and 9 schematically illustrate part of the electron gun 10 of the electron microscope 100. Note that, in FIG. 9, part of the electron gun 10 is separated into constituent members and the constituent members are illustrated.

As illustrated in FIGS. 8 and 9, in the electron gun 10, the filament can be replaced by replacing a filament unit 102. A spacer 104 can be disposed between the filament unit 102 and the Wehnelt electrode 14. The filament height can be adjusted by changing the number of spacers 104 disposed between the filament unit 102 and the Wehnelt electrode 14.

Note that the embodiments and the modifications described above are only exemplary, and are not limited to those described above. For example, the embodiments and the modification may be combined appropriately.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but those skilled in the art would readily appreciate that many modifications are possible in the embodiments without materially departing from the novel teachings and effects of the invention. Accordingly, all such modifications are intended to be included within the scope of the invention.

What is claimed is:

1. A control method for an electron microscope, the electron microscope comprising a thermionic-emission gun of self-bias type using a fixed bias resistor, an accelerating voltage power supply supplying an accelerating voltage to the thermionic-emission gun, and an optical system for irradiating a specimen with an electron beam, the control method comprising:
    obtaining a value of a load current which is a current passing through the accelerating voltage power supply;
    determining a filament height of the thermionic-emission gun based on the value of the load current; and
    setting a condition of the optical system based on the filament height.

2. The control method for an electron microscope according to claim 1, wherein, in setting the condition of the optical system, the condition of the optical system is set by using a table illustrating a relationship between the filament height and the condition of the optical system.

3. The control method for an electron microscope according to claim 1, further comprising replacing the filament, wherein
    obtaining the value of the load current is performed after replacing the filament.

4. The control method for an electron microscope according to claim 1, wherein, in setting the condition of the optical system, a condition of the optical system under which a desired probe current is obtainable is set based on the filament height.

5. An electron microscope comprising:
    a thermionic-emission gun of self-bias type using a fixed bias resistor;
    an accelerating voltage power supply supplying an accelerating voltage to the thermionic-emission gun;
    an ammeter measuring a value of a load current which is a current passing through the accelerating voltage power supply;
    an optical system for irradiating a specimen with an electron beam; and
    a control section controlling the thermionic-emission gun and the optical system,
    the control section performing:
    processing of obtaining the value of the load current;
    processing of determining a filament height of the thermionic-emission gun based on the value of the load current; and
    processing of setting a condition of the optical system based on the filament height.

* * * * *